United States Patent
Watanabe

(10) Patent No.: US 7,190,436 B2
(45) Date of Patent: Mar. 13, 2007

(54) ILLUMINATION APPARATUS AND EXPOSURE APPARATUS

(75) Inventor: Yutaka Watanabe, Tochigi-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 43 days.

(21) Appl. No.: 11/062,024

(22) Filed: Feb. 18, 2005

(65) Prior Publication Data

US 2005/0185165 A1 Aug. 25, 2005

(30) Foreign Application Priority Data

Feb. 19, 2004 (JP) .............................. 2004-042802

(51) Int. Cl.
G03B 27/54 (2006.01)
G03B 27/42 (2006.01)

(52) U.S. Cl. .......................... 355/67; 355/53

(58) Field of Classification Search ................. 355/53, 355/67; 378/119; 359/156
See application file for complete search history.

(56) References Cited

U.S. PATENT DOCUMENTS

| 6,038,279 A | 3/2000 | Miyake et al. |
| 6,069,937 A | 5/2000 | Oshino et al. |
| 6,285,743 B1* | 9/2001 | Kondo et al. ................ 378/119 |
| 6,438,199 B1* | 8/2002 | Schultz et al. ................ 378/34 |
| 6,590,959 B2 | 7/2003 | Kandaka et al. |
| 6,639,652 B1* | 10/2003 | Mori et al. .................... 355/67 |
| 2003/0053217 A1* | 3/2003 | Mori .......................... 359/619 |
| 2004/0028175 A1* | 2/2004 | Antoni et al. ................. 378/34 |
| 2004/0218164 A1* | 11/2004 | Kohno ........................ 355/67 |

FOREIGN PATENT DOCUMENTS

| JP | 9-115813 A | 5/1997 |
| JP | 11-40480 A | 2/1999 |
| JP | 2002-6096 A | 1/2002 |

* cited by examiner

Primary Examiner—W. B. Perkey
Assistant Examiner—Kevin Gutierrez
(74) Attorney, Agent, or Firm—Morgan & Finnegan, LLP

(57) ABSTRACT

An illumination apparatus for illuminating a target surface using light includes a light source that emits the light, a reflection integrator that forms plural secondary light sources using the light from the light source, and an optical unit that differentiates Helmholtz-Lagrange invariants in two orthogonal directions with respect to the light incident upon the reflection integrator.

10 Claims, 9 Drawing Sheets

ILLUMINATION APPARATUS AND EXPOSURE APPARATUS

BACKGROUND OF THE INVENTION

The present invention relates generally to an illumination apparatus, and more particularly to an illumination apparatus and an exposure apparatus used to expose an object, such as a single crystal substrate for a semiconductor wafer, and a glass plate for a liquid crystal display ("LCD"). The present invention is suitable, for example, for an illumination apparatus for an exposure apparatus that uses the X-ray and the extreme ultraviolet ("EUV") light as an exposure light.

A reduction projection exposure apparatus has been conventionally employed which uses a projection optical system to project a circuit pattern formed on a mask (reticle) onto a wafer, etc. to transfer the circuit pattern, in manufacturing such a fine semiconductor device as a semiconductor memory and a logic circuit in photolithography technology.

The minimum critical dimension to be transferred by the projection exposure apparatus or resolution is proportionate to a wavelength of light used for exposure, and inversely proportionate to the numerical aperture ("NA") of the projection optical system. The shorter the wavelength is, the better the resolution is. Along with recent demands for finer semiconductor devices, a shorter wavelength of ultraviolet light has been promoted from an ultra-high pressure mercury lamp (i-line with a wavelength of approximately 365 nm) to KrF excimer laser (with a wavelength of approximately 248 nm) and ArF excimer laser (with a wavelength of approximately 193 nm).

However, the lithography using the ultraviolet light has the limit to satisfy the rapidly promoting fine processing of a semiconductor device, and a reduction projection exposure apparatus that uses the EUV light with a wavelength of 10 to 15 nm shorter than that of the ultraviolet (which is referred to as an "EUV exposure apparatus" hereinafter) has been developed to efficiently transfer a very fine circuit pattern of 0.1 µm or less.

A light source of the EUV exposure apparatus includes a laser produced plasma ("LPP") light source that irradiates the laser onto a target and captures the EUV light from the generated plasma, and a discharge plasma light source that pinches or converges the plasma generated from the discharge under a low-pressure gas atmosphere, and captures the EUV light from the pinched plasma.

The plasma is a light emitting point in these light sources, and the bigger plasma provides more EUV light. The EUV light emits from the plasma approximately isotropically and the bigger capture angle provides more EUV light.

The EUV light source in the EUV exposure apparatus needs the etendue of 1–3.3 mm$^2$ sr or smaller. The etendue is defined by S×Ω, where S is a plasma size, and Ω is a solid angle at which the light is captured from the plasma. The upper limit of the etendue restricts a size of the light source and the capture angle.

The upper limit of the etendue is determined, because an ideal or aplanatic optical system does not change the etendue and an optical system that has the aberration has a large etendue. Since the projection optical system in the exposure apparatus is an optical system that sufficiently reduces each aberration, the etendue of the exposure light irradiated from the projection optical system onto the wafer as a substrate is approximately equal to the etendue of the light captured from the reticle as an original to the projection optical system. For example, when the light having an NA of 0.25 (or a solid angle of 0.2 sr) enters an area having a width of 2 mm and a length of 26 mm on the wafer, the etendue becomes 10.4 mm$^2$ sr. A ratio between the NA of the light irradiated onto the reticle from the illumination optical system and the NA of the light captured from the reticle to the projection optical system is called a coherence factor σ and set to a value smaller than 1. The coherence factor σ relates to the square of the etendue: For example, when σ is 0.8, the etendue of the light irradiated from the illumination optical system to the reticle is 6.7 mm$^2$ sr.

In general, the light emitting point has an intensity distribution and a positional offset, and an integrator is used to reduce these influences. The integrator divides the light into plural secondary light sources, combines the lights from the secondary light sources, and makes the light intensity distribution uniform. Thereby, the light irradiated onto the reticle has a uniform light intensity. In the integrator as a thus serving optical element, the exit light's etendue is much greater than the incident light's etendue. Thus, the EUV exposure apparatus is required to maintain the etendue of the light that emits from the light emitting point 1–3.3 mm$^2$ sr or smaller.

The fundamental object of the extensive research and development of the EUV light source is to propose a light source that introduces the symmetrical light to an illumination optical system with respect to the optical axis. See, for example, Japanese Patent Application No. 2002-6096. On the other hand, a light source that uses plural X-ray sources has also been proposed. See, for example, Japanese Patent Application No. 9-115813 and 11-40480.

While the above estimation of the etendue assumes that the light irradiated onto the wafer has different width and length directions, the light use efficiency lowers in the narrow width direction when the light symmetrical with respect to the optical axis enters the illumination optical system. In this case, the non-used light heats the illumination optical system and thermally deforms the optical element, causing the deteriorated optical performance.

Accordingly, it is conceivable to improve the light use efficiency by reducing the etendue from the light source and by using the integrator for the longer width direction so as to enlarge the length or the angle and appropriately set the etendue. However, in this case, the small etendue reduces the intensity of the light captured from the light emitting point. This results in the small light intensity for irradiating the wafer, and causes the lowered throughput of the exposure apparatus.

BRIEF SUMMARY OF THE INVENTION

Accordingly, the present invention is directed to an illumination apparatus that enables an exposure apparatus to improve the use efficiency of the light having a small etendue and illumination light intensity uniformity and to have good optical performance and throughput.

An illumination apparatus according to one aspect of the present invention for illuminating a target surface using light includes a light source that emits the light, a reflection integrator that forms plural secondary light sources using the light from the light source, and an optical unit that differentiates Helmholtz-Lagrange invariants in two orthogonal directions with respect to the light incident upon the reflection integrator.

An exposure apparatus for exposing a pattern of a reticle onto an object includes the above illumination apparatus for illuminating the reticle, and a projection optical system for projecting the pattern of the reticle onto the object.

A device manufacturing method according to another aspect of the present invention includes the steps of exposing an object to be exposed using the above exposure apparatus, and developing the object exposed.

Other objects and further features of the present invention will become readily apparent from the following description of the preferred embodiments with reference to accompanying drawings.

DETAILED DESCRIPTION OF THE PREFERRED EMBODIMENTS

Figure 1:
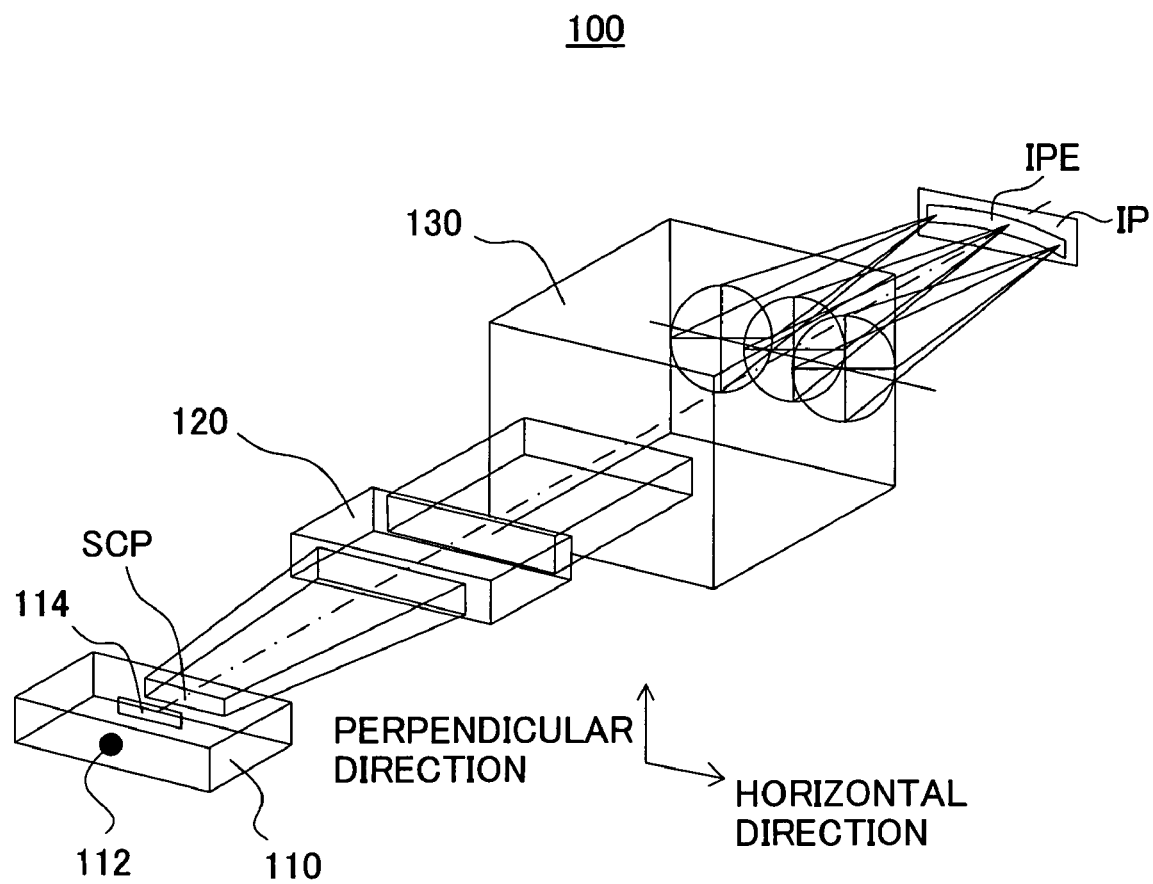
FIG. 1 is a schematic perspective view of a structure of an illumination apparatus according to one aspect of the present invention.

A description will be given of an illumination apparatus 100 according to one embodiment of the present invention. Like elements in each figure are designated by the same reference numerals, and a duplicate description will be omitted.

A description will now be given of a principle of the Helmholtz-Lagrange invariant for better understanding of the illumination apparatus 100 according to one aspect of the present invention. The Helmholtz-Lagrange invariants are defined as $\alpha \cdot y$ and $\alpha' \cdot y'$ where y and y' are sizes of the object and image, and $\alpha$ and $\alpha'$ are converted inclinations (Lens Designing, Yosiya Matsui, Kyoritsu Publishing). While they are calculated within a plane that includes an optical axis, the Helmholtz-Lagrange invariants are similarly defined within a plane perpendicular to the above plane as $x \cdot \beta$ and $x' \cdot \beta'$, where x and x' are sizes of the object and image, and $\beta$ and $\beta'$ are converted inclinations. Relationships $\alpha \cdot y = \alpha' \cdot y'$ and $x \cdot \beta = x' \cdot \beta'$ are met before and after the optical system. The etendue corresponds to a product of the Helmholtz-Lagrange invariants within two orthogonal planes, which is expressed by a product of an area and a solid angle, not a product of an area and the converted inclination, or approximately corresponds to a product of the Helmholtz-Lagrange invariants times a factor $\pi$.

When the Helmholtz-Lagrange invariants differ in two directions on the illumination area., an etendue, which is greater than that obtained with the axially symmetrical light, can be captured and a ratio of the non-used light resulting in the heat can be reduced, by according the direction having a larger Helmholtz-Lagrange invariant on the illumination area with a direction of the light incident upon the integrator which has a larger Helmholtz-Lagrange invariant.

In order to differentiate the Helmholtz-Lagrange invariants of the light incident upon the integrator in two orthogonal directions, one measure is to use, as described later, a condenser optical system that condenses the light emitted from the light emitting point, and forms a secondary light emitting point that approximately equalizes the Helmholtz-Lagrange invariants in two orthogonal directions, and optical means that includes a mirror or an aperture applied to the light from the secondary light emitting point.

Since the light approximately isotropically emits from the plasma as a light emitting point, the secondary light emitting point that differentiates the Helmholtz-Lagrange invariants in two orthogonal directions can be formed by differentiating lengths of the plasma shape in two orthogonal directions via the condenser optical system. In addition, the secondary light emitting point that differentiates the Helmholtz-Lagrange invariants in two orthogonal directions can be formed by using the condenser optical system that differentiates light condensing angles in two directions perpendicular to the arrangement direction of the condenser optical system from the light emitting point.

FIG. 1 is a schematic perspective view showing a structure of the inventive illumination apparatus 100. The illumination apparatus 100 illuminates a target surface IP, such as a reticle having a circuit pattern to be transferred, and includes a light source section 110, a reflection integrator 120, and an illumination optical system 130. The light source section 110 includes a light emitting point 112, and a condenser optical system 114, and forms a secondary condensing point SCP formed by the condenser optical system 114. The light source section 110 is an EUV light source that emits the EUV light having a wavelength between 5 nm and 40 nm.

The reflection integrator 120 reflects the EUV light emitted from the light source section 110, and mitigates the influences of the positional variances of the light source section 110, and non-uniformity of the light intensity distribution on the target surface IP. This embodiment sets the horizontal length longer than the perpendicular length of the EUV light, which has been emitted from the secondary condensing point SCP and captured by the first reflection integrator 120 along the optical path from the light source section 110. Since the capture angle is approximately equal in these two orthogonal (i.e., horizontal and perpendicular) directions, the Helmholtz-Lagrange invariant in the horizontal direction is greater than that in the perpendicular direction.

The illumination optical system 130 captures the EUV light emitted from the reflection integrator 120. The illumination optical system 130 shapes the illumination area IPE on the target surface IP into an arc, and illuminates the target surface IP so that each point has almost the same solid angle on the illumination area IPE. The reflection integrator forms plural secondary light sources with incident light, and the light emitted from each of the plural secondary light sources superimposes on the illumination area IPE and the light intensity distribution becomes approximately uniform on the illumination area IPE.

This embodiment forms the illumination optical system 130 such that the horizontal direction that has the greater Helmholtz-Lagrange invariant corresponds to the length direction of the illumination area IPE. Therefore, it is possible to improve the use efficiency of the EUV light from the light source section 110 to the illumination area IPE.

Figure 2:
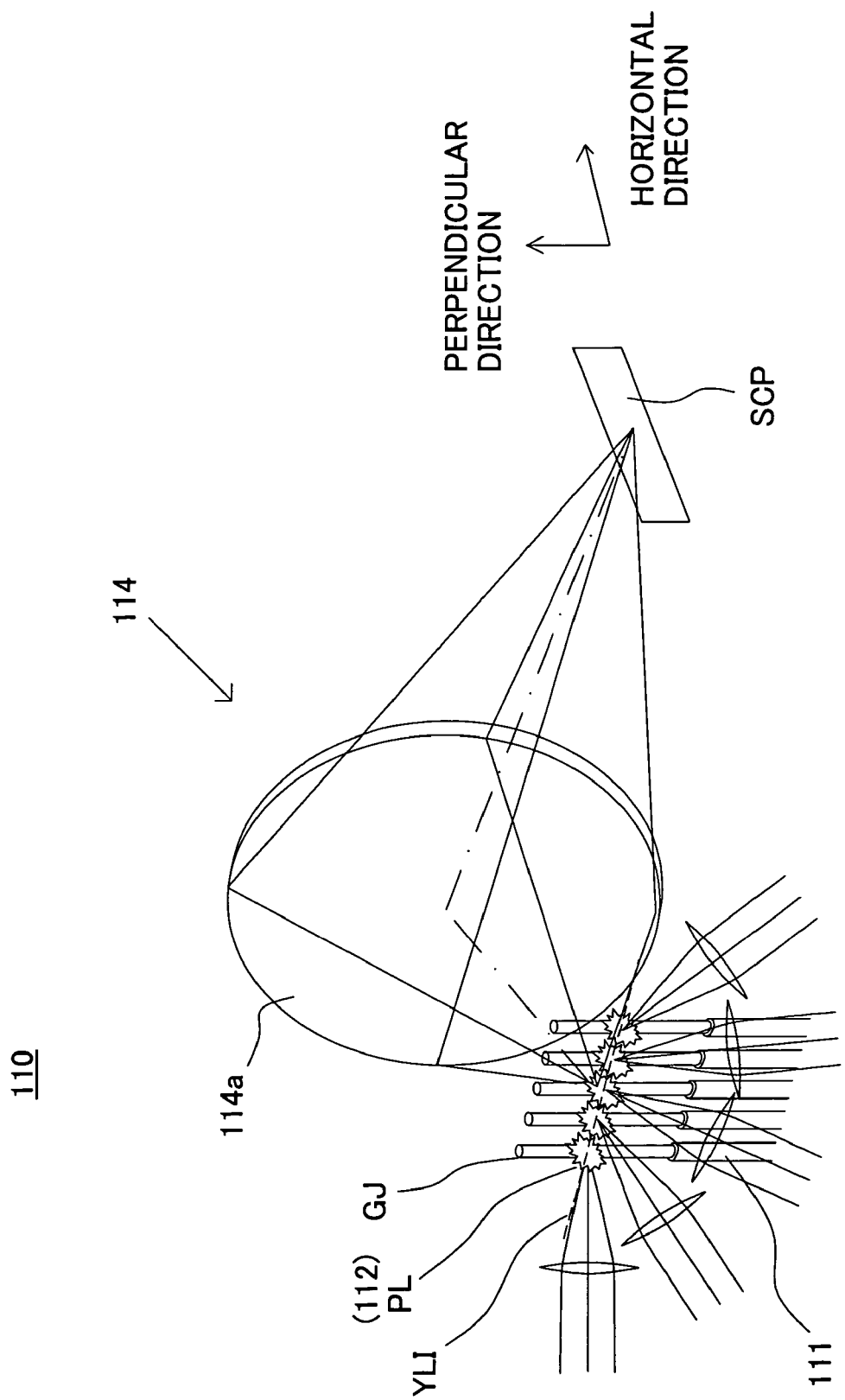
FIG. 2 is a schematic perspective view of a structure of a light source section in the illumination apparatus shown in FIG. 1.

FIG. 2 shows the light source section that makes the horizontal length longer than the perpendicular length of the secondary condensing point SCP and approximately equalizes the capture angle in these two orthogonal (i.e., horizontal and perpendicular) directions. The light source section 110 is implemented as a LPP light source that includes a nozzle 111, an irradiation section (not shown) that irradiates the YAG laser YLI, and a mirror 114a.

The nozzle 111 emits liquid Xe gas jets GJ. This embodiment arranges plural nozzles 111 in the horizontal direction, and forms plural liquid Xe gas jets GJ.

The YAG laser YLI is condensed and irradiated onto the Xe gas jets GJ, and the horizontally arranged plasmas PL and the EUV light from each of the plural plasmas PL are generated. The plural plasmas PL are light emitting points 112. The secondary light emitting points SCP that makes the horizontal length longer than the perpendicular length and approximately equalizes the capture angle in two orthogonal (i.e., horizontal and perpendicular) directions can be formed by imaging the light emitting point 112 via the (condenser) mirror 114a in the condenser optical system 114. The mirror 114a has a reflection surface that forms a multilayer coating that layers two types of materials having different optical constants alternately. The multilayer coating alternately layers molybdenum (Mo) and silicon (Si) on the glass plate surface that has been polished into a precise shape.

While this embodiment uses the LPP light source as the light source section 110, the discharge plasma light source can implement similar effects to the instant embodiment by differentiating the lengths of the plasma PL in two directions perpendicular to the arrangement direction of the (condenser) mirror 114a.

Figure 3:
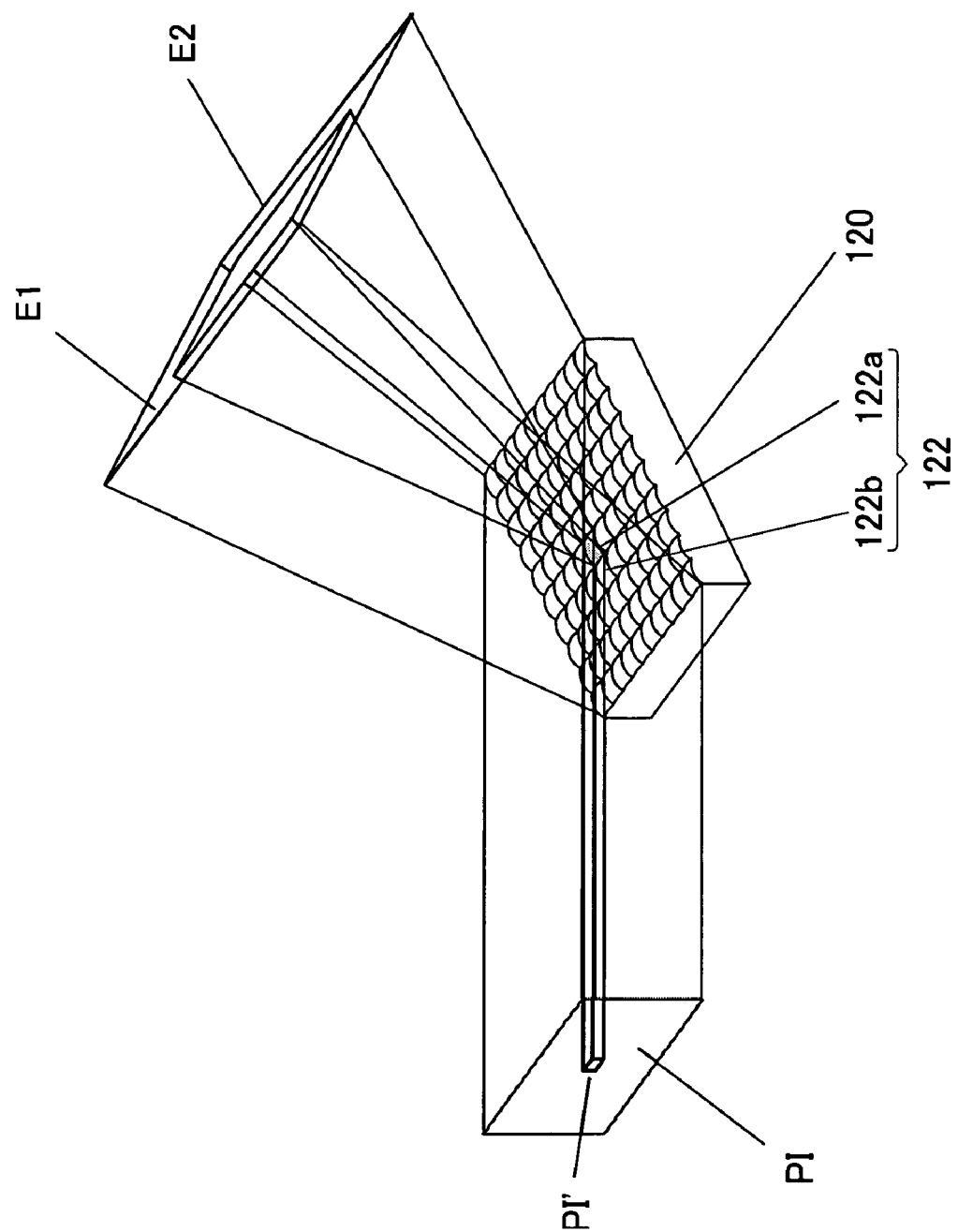
FIG. 3 is a schematic perspective view of a structure of a reflection integrator in the illumination apparatus shown in FIG. 1.

The reflection integrator 120 uses an optical element that arranges plural convex mirrors 122 such that the EUV light reflected from one convex mirror 122a approximately superimposes the EUV light reflected from adjacent convex mirror 122b, as shown in FIG. 3. FIG. 3 is a schematic perspective view showing a structure of the reflection integrator 120.

A description will now be given of a function of the reflection integrator 120 that receives parallel light for simple description. The reflection integrator 120 as a whole reflects the collimated light PI to the area E1. On the other hand, one convex mirror 122 in the reflection integrator 120 reflects the collimated light PI' emitted from part of the area of the collimated light PI to the area E2. While the area E2 is smaller than the area E1, a ratio between the areas E2 and E1 is greater than a ratio between the areas of the collimated light PI' and the collimated light PI, and the area E2 makes the light intensity of the collimated light PI uniform.

Figure 4:
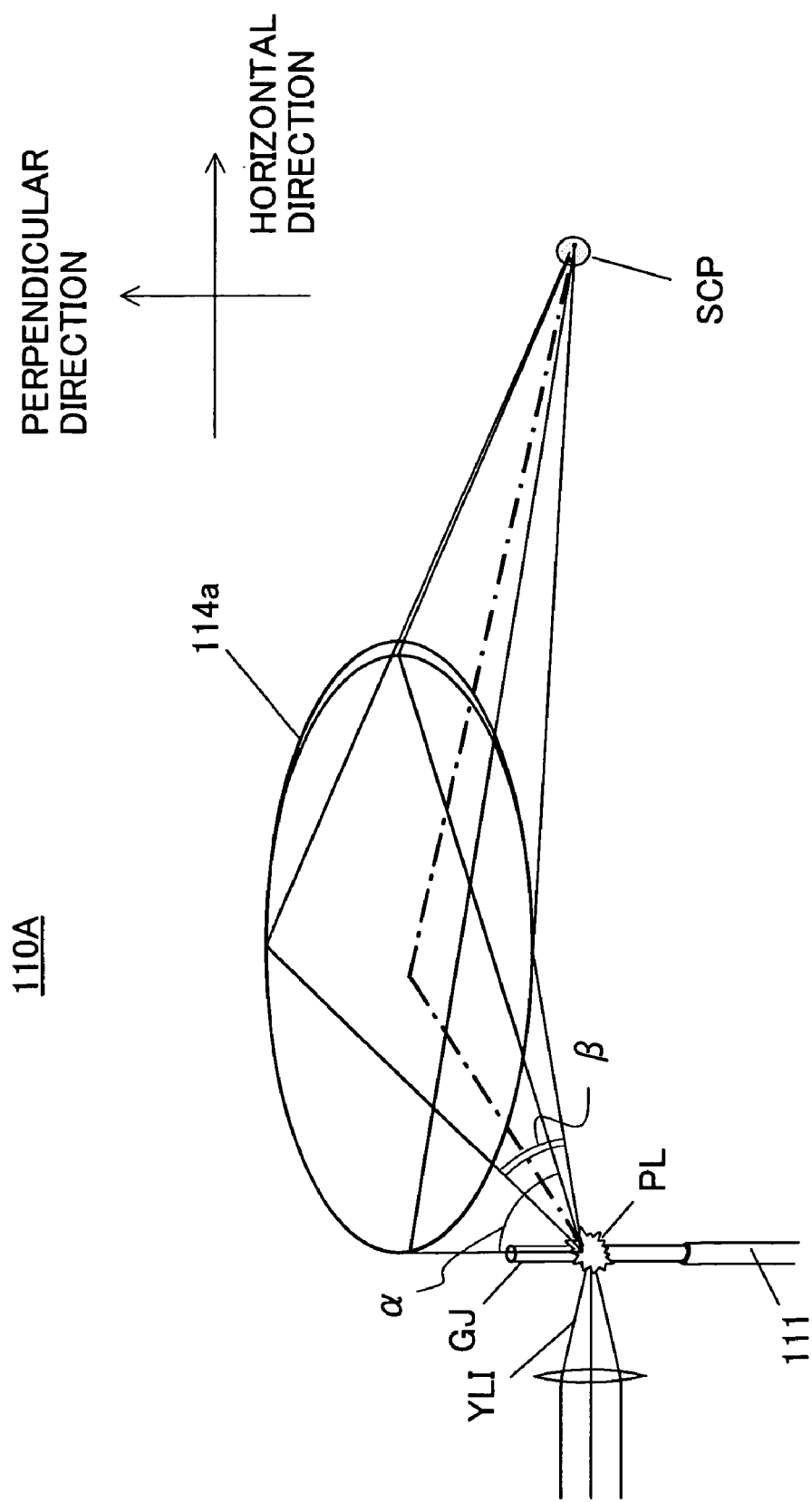
FIG. 4 is a schematic perspective view of a variation of the light source section in the illumination apparatus shown in FIG. 1.

FIG. 4 is a schematic perspective view showing the light source section 110A as a variation of the light source section 110. Even use of the light source section 110A can differentiate the Helmholtz-Lagrange invariants in horizontal and perpendicular directions of the EUV light incident upon the reflection integrator 120. The light source section 110A is implemented as a LPP light source that includes a nozzle 111, an irradiation section (not shown) that irradiates the YAG laser YLI, and a mirror 114a.

The YAG laser YLI is irradiated onto the Xe gas jets GJ emitted from the nozzle 111, and the plasma PL is generated. The light source section 110A sets a horizontal capture angle a greater than a perpendicular capture angle $\beta$, where a is the horizontal capture angle corresponding to the longitudinal direction of the illumination area IPE, and $\beta$ is the perpendicular capture angle corresponding to the width direction of the illumination area IPE. Therefore, the Helmholtz-Lagrange invariants are made different on the secondary condensing point SCP in the horizontal and perpendicular directions.

Since the Helmholtz-Lagrange invariant is a product between the size of the object or image and converted inclination, use of a proper optical system can enlarge the image and equalize the converted inclination to one in the direction having the smaller Helmholtz-Lagrange invariant.

The illumination apparatus 100 uses the light sources 110 or 110A, the reflection integrator 120, and the illumination optical system 130 shown in FIGS. 1 and 3, efficiently illuminates the illumination area IPE.

Figure 5:
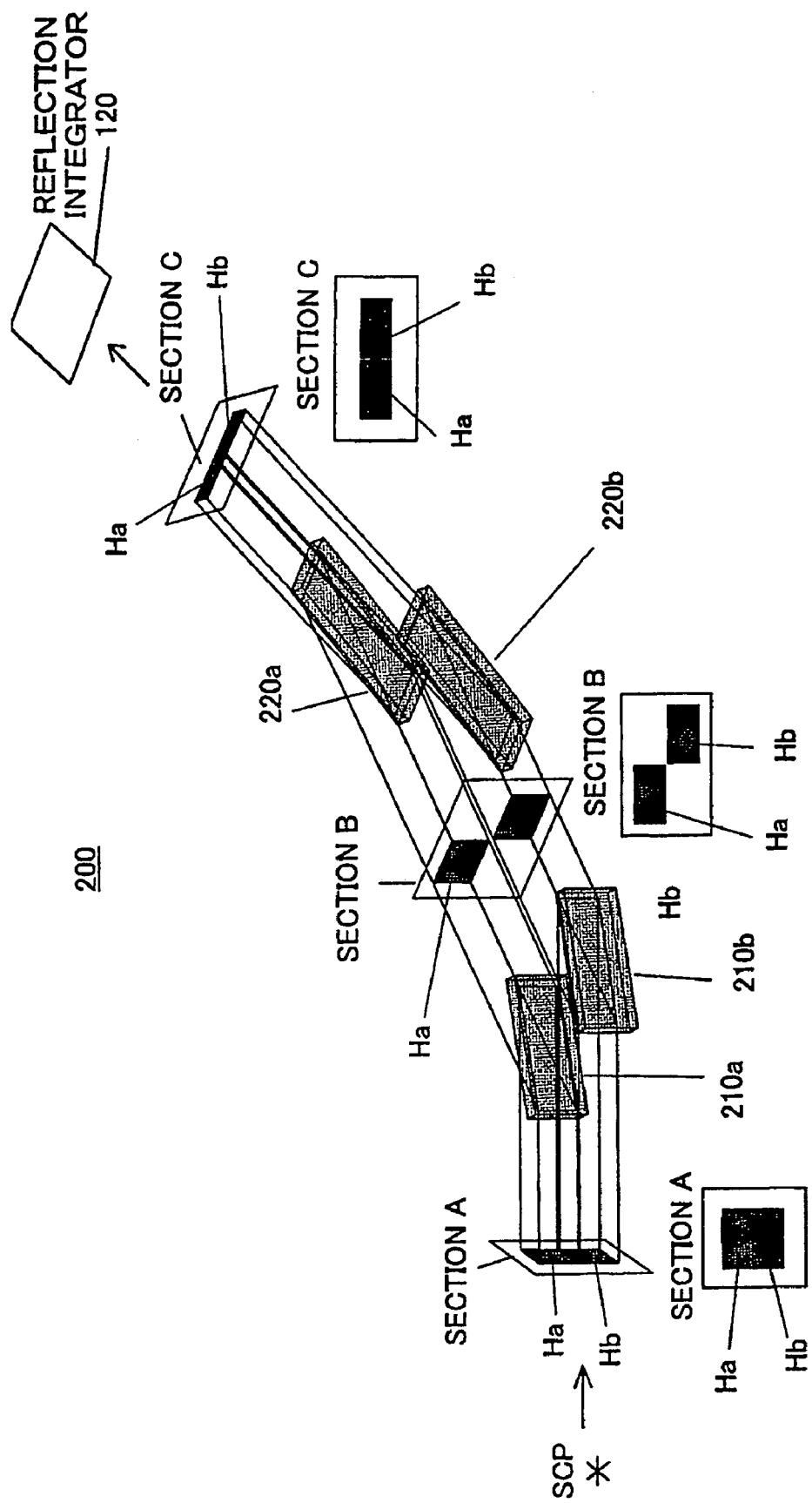
FIG. 5 is a schematic perspective view showing one exemplary structure of an optical means that differentiates Helmholtz-Lagrange invariants in two orthogonal directions with respect to the EUV light incident upon the reflection integrator shown in FIG. 1.

A description will now be given of a conversion of the light having the approximately equal Helmholtz-Lagrange invariants in two (i.e., horizontal and perpendicular) directions into the light having the different Helmholtz-Lagrange invariants in two directions. It is assumed that the EUV light is the collimated light for simple description. This embodiment uses optical means 200 that differentiates the Helmholtz-Lagrange invariants in two orthogonal directions for the EUV light incident upon the reflection integrator 120. FIG. 5 is a schematic perspective view of one exemplary structure of the optical means 200.

Referring to FIG. 5, the EUV light has the same Helmholtz-Lagrange invariants in the horizontal and perpendicular directions at a section A. This EUV light is divided into two upper and lower areas Ha and Hb, and introduced into the mirrors 210a and 210b obliquely.

Among these two mirrors 210a and 210b, the mirror 210a is located closer to the section A than the mirror 210b (or the mirror 210b is farther from the section A than the mirror 210a). Therefore, the two areas Ha and Hb are laterally separated at a section B. An adjustment of the distance between the mirrors 210a and 210b can prevent the two areas Ha and Hb at the section B from overlapping each other in the longitudinal direction as shown in FIG. 5.

Next, the EUV light that laterally separates the two areas Ha and Hb is incident obliquely upon the two mirrors 220a and 220b. Among these two mirrors 220a and 220b, the mirror 220a is farther from the section B from the mirror 220b (or the mirror 220b is closer to the section B than the mirror 220a). Therefore, two areas Ha and Hb move longitudinally at a section C. An adjustment of the distance between the mirrors 210a and 210b can laterally align the two areas Ha and Hb with each other at the section C as shown in FIG. 5.

Thus, use of the mirrors 210a, 201b, 220a, and 220b that are arranged at adjusted positions can convert the light having the approximately equal Helmholtz-Lagrange invariants in two (i.e., horizontal and perpendicular) directions into the light having the different Helmholtz-Lagrange invariants in two directions. While this embodiment changes the Helmholtz-Lagrange invariants in two directions, it is understood that the etendue does not change.

When the optical means 200 is used, the light intensity distribution may possibly become non-uniform since the mirror has a shadow portion. For example, at the section C, the light intensity becomes small between the areas Ha and Hb. In order to mitigate this reduction, the two mirrors 220*a* and 220*b* are rotated slightly around the optical axis so as to approach the two areas Ha and Hb to each other. Moreover, the great change of the light intensity distribution can be reduced by forming the horizontal light intensity distribution at the section A into a trapezoid, and by adjusting the approaching amount. In other words, the integrator should be provided subsequent to the section C so as to maintain the uniformity of the light intensity distribution required for the exposure apparatus.

Since the oblique incidence of the EUV light has high reflectance, the instant embodiment uses the oblique incidence. The perpendicular incidence using a multilayer coating exhibits a high reflectance to the EUV light. Therefore, the perpendicular incidence may be used when the mirrors 210*a*, 210*b*, 220*a*, and 220*b* use a multilayer coating mirror.

The optical means for converting the light having the approximately equal Helmholtz-Lagrange invariants in two (i.e., horizontal and perpendicular) directions into the light having the different Helmholtz-Lagrange invariants in two directions is not limited to the above mirror system.

Figure 6:
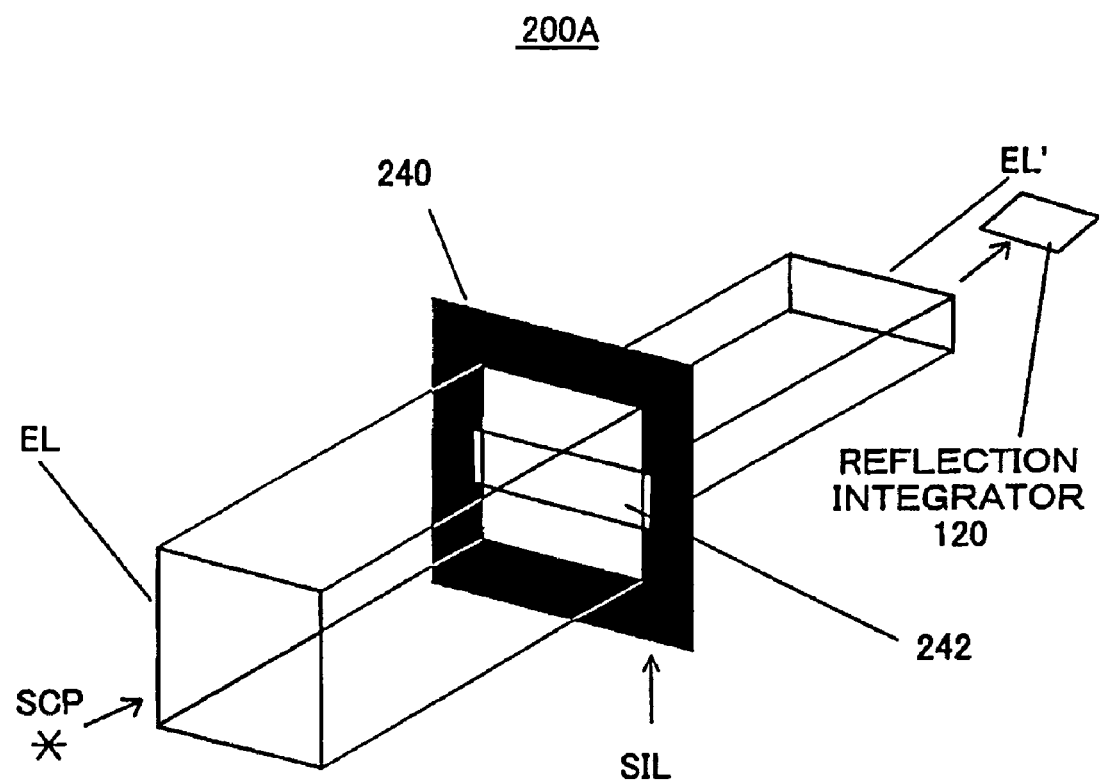
FIG. 6 is a schematic perspective view showing another exemplary structure of an optical means that differentiates Helmholtz-Lagrange invariants in two orthogonal directions with respect to the EUV light incident upon the reflection integrator shown in FIG. 1.

FIG. 6 is a schematic perspective view showing one exemplary structure of another optical means 200A that differentiates the Helmholtz-Lagrange invariants in two orthogonal directions of the EUV light incident upon the reflection integrator 120.

The optical means 200A converts the EUV light EL that is condensed by the secondary light source with a large etendue into the EUV light EL' that has Helmholtz-Lagrange invariants different in two directions, by arranging an aperture 240 having a rectangular opening 242 having two different sides at a secondary light source position SIL.

The optical means 200A cannot expect the efficient use of the EUV light, but uses a simple structure and can convert the light having the approximately equal Helmholtz-Lagrange invariants in two directions into the light having Helmholtz-Lagrange invariants different in two directions.

The optical means 200A is suitable for a light source that has a large etendue and a sufficiently large light intensity. When the EUV light that maintains the large etendue enters the integrator without using the optical means 200A in this light source, unnecessary light that cannot be used in the subsequent illumination optical system occurs and causes the thermal strain in a highly processed optical element and non-uniform illumination intensity.

The illumination apparatus 100 can provide, for example, efficient use of the light to the small etendue required for the EUV light source for the exposure apparatus, and reduce the unused light that would heat the illumination optical system. This configuration provides an exposure apparatus that restrains the thermal strain of the highly precisely processed optical element in the illumination optical system, improves the illumination intensity uniformity, and has good optical performance and throughput.

Figure 7:
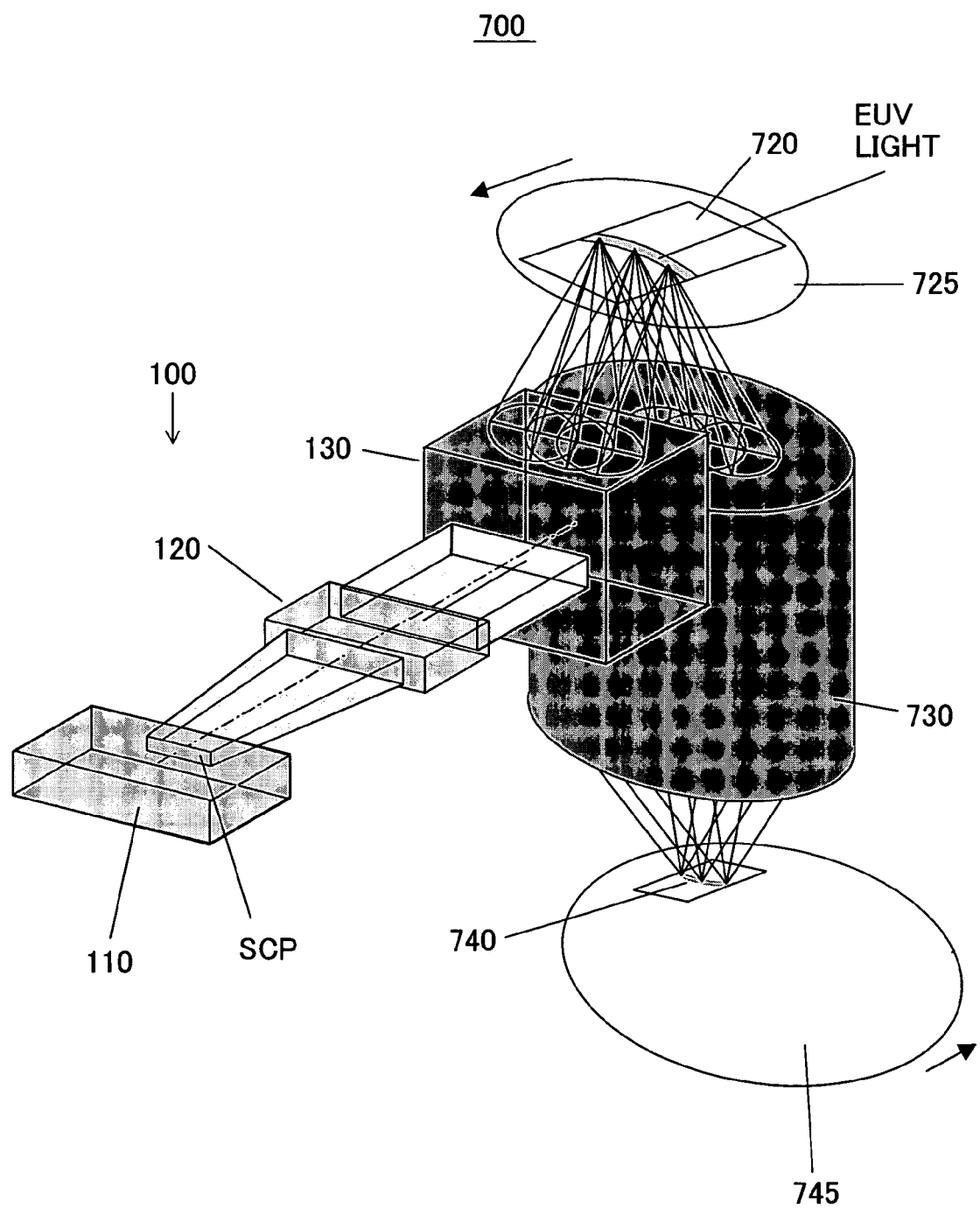
FIG. 7 is a schematic perspective view of a structure of an exposure apparatus according to one aspect of the present invention.

Referring now to FIG. 7, a description will be given of an illustrative exposure apparatus 700 that applies the inventive illumination apparatus 100. Here, FIG. 7 is a schematic perspective view of a structure of the exposure apparatus 700.

The inventive exposure apparatus 700 uses the EUV light (with a wavelength of, e.g., 13.4 nm) as illumination light for exposure, and exposes a circuit pattern of a reticle 720 onto an object 740, for example, in a step-and-scan manner or step-and-repeat manner. This exposure apparatus is suitable for a lithography process less than submicron or quarter micron, and the present embodiment uses the step-and-scan exposure apparatus (also referred to as a "scanner") as an example. The "step-and-scan manner", as used herein, is an exposure method that exposes a reticle pattern onto a wafer by continuously scanning the wafer relative to the reticle, and by moving, after a shot of exposure, the wafer stepwise to the next exposure area to be shot. The "step-and-repeat manner" is another mode of exposure method that moves a wafer stepwise to an exposure area for the next shot every shot of cell projection onto the wafer.

Referring to FIG. 7, the exposure apparatus 700 includes an illumination apparatus 100, a reticle stage 725 mounted with a reticle 720, a projection optical system 730, and a wafer stage 745 mounted with an object 740 to be exposed. At least the optical path through which the EUV light travels should preferably be maintained in a vacuum atmosphere, although not shown in FIG. 7, since the EUV light has low transmittance for air.

The illumination apparatus 100 illuminates the reticle 720 using the EUV light (with a wavelength of, for example, 13.4 nm) having an arc shape corresponding to the arc-shaped field of the projection optical system 730. The illumination apparatus 100 can apply the above embodiment, and a detailed description will be omitted.

The reticle 720[please check this correction to see if it is right] is a reflection reticle, and has a circuit pattern (or image) to be transferred. It is supported and driven by the reticle stage 725. The diffracted light emitted from the reticle 720 is projected onto the object 740 after reflected by the projection optical system 730. The reticle 720 and object 740 are arranged optically conjugate with each other. Since the exposure apparatus 700 is a scanner, the reticle 720 and object 740 are scanned to transfer a reduced size of a pattern of the reticle 720 onto the object 740.

The reticle stage 725 supports the reticle 720 and is connected to a moving mechanism (not shown). The reticle stage 725 can apply any structures known in the art. The moving mechanism (not shown) includes a linear motor, and drives the reticle stage 725 at least in the X direction so as to move the reticle 720. The exposure apparatus 700 scans the reticle 720 and the object 740 synchronously.

The projection optical system 730 uses plural (multilayer coating) mirrors to project a reduced size of a pattern of the reticle 720 onto the object 740. The number of mirrors is about four to six. For wide exposure area with the small number of mirrors, the reticle 720 and object 740 are simultaneously scanned to transfer a wide area that is a narrow arc-shaped area or ring field apart from the optical axis by a predetermined distance. The projection optical system 730 has a NA of about 0.2 to 0.3.

The instant embodiment uses a wafer as the object 740, but it may include a spherical semiconductor and liquid crystal plate and a wide range of other objects to be exposed. Photoresist is applied onto the object 740.

The object 740 is held onto the wafer stage 745 by a wafer chuck 745*a*. The wafer stage 745 moves the object 740, for example, using a linear motor in XYZ directions. The reticle 720 and the object 740 are synchronously scanned. The positions of the reticle stage 725 and wafer stage 745 are monitored, for example, by a laser interferometer, and driven at a constant speed ratio.

In exposure, the EUV light emitted from the illumination apparatus 100 illuminates the reticle 720, and the projection optical system 730 images a pattern of the reticle 720 onto the object 740 surface. The instant embodiment uses an arc or ring shaped image plane, scans the reticle 720 and object 740 at a speed ratio corresponding to a reduction ratio to expose the entire surface of the reticle 720. The illumination apparatus 100 used for the exposure apparatus 700 can improve the use efficiency and the illumination intensity uniformity of the light having a small etendue. Thus, the exposure apparatus 700 can provide devices, such as semiconductor devices, LCD devices, image pickup devices (e.g., a CCD), and thin-film magnetic heads, with good throughput and economic efficiency.

Figure 8:
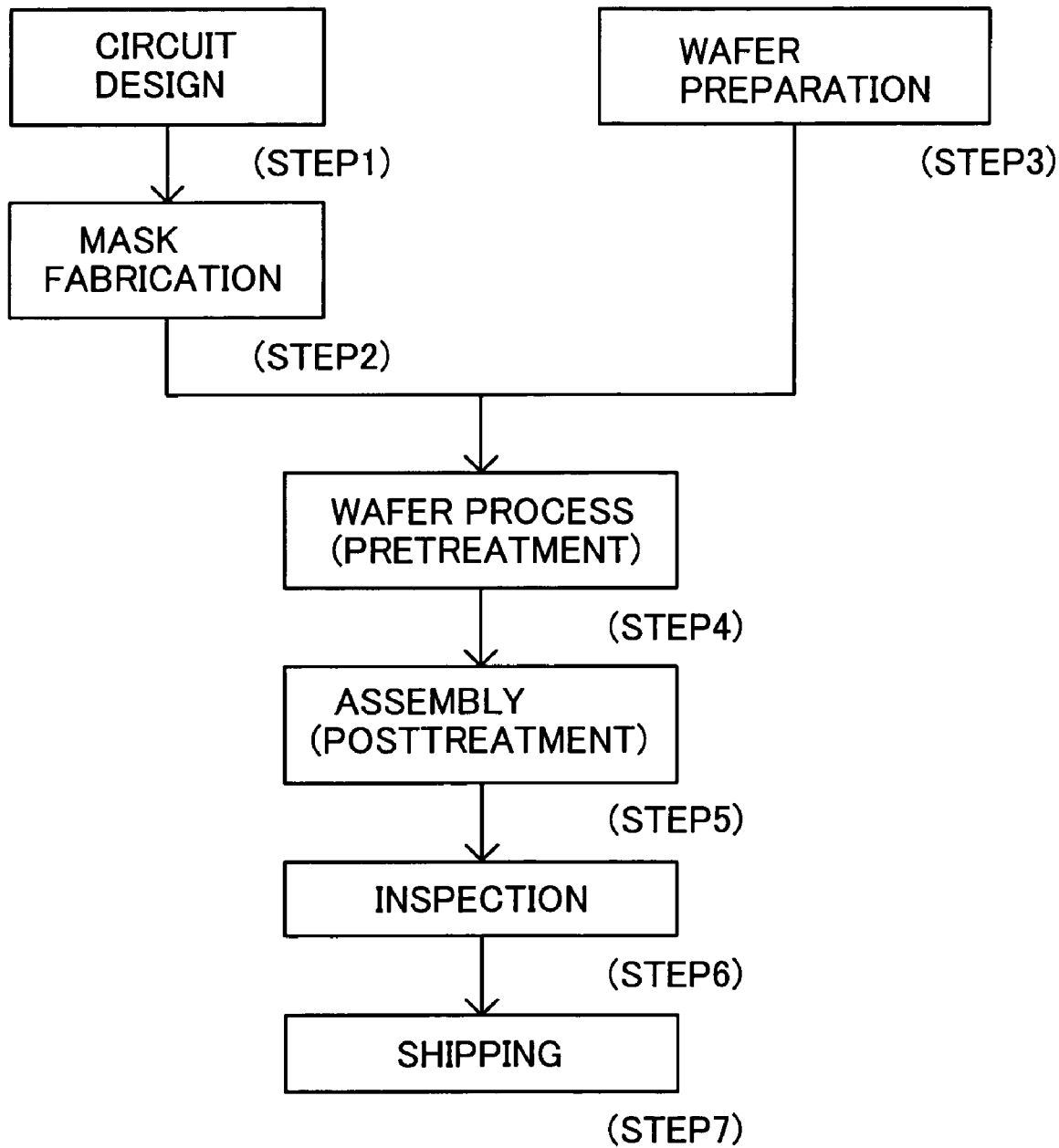
FIG. 8 is a flowchart for explaining a method for fabricating devices (semiconductor chips such as ICs, LSIs, and the like, LCDs, CCDs, etc.).
Figure 9:
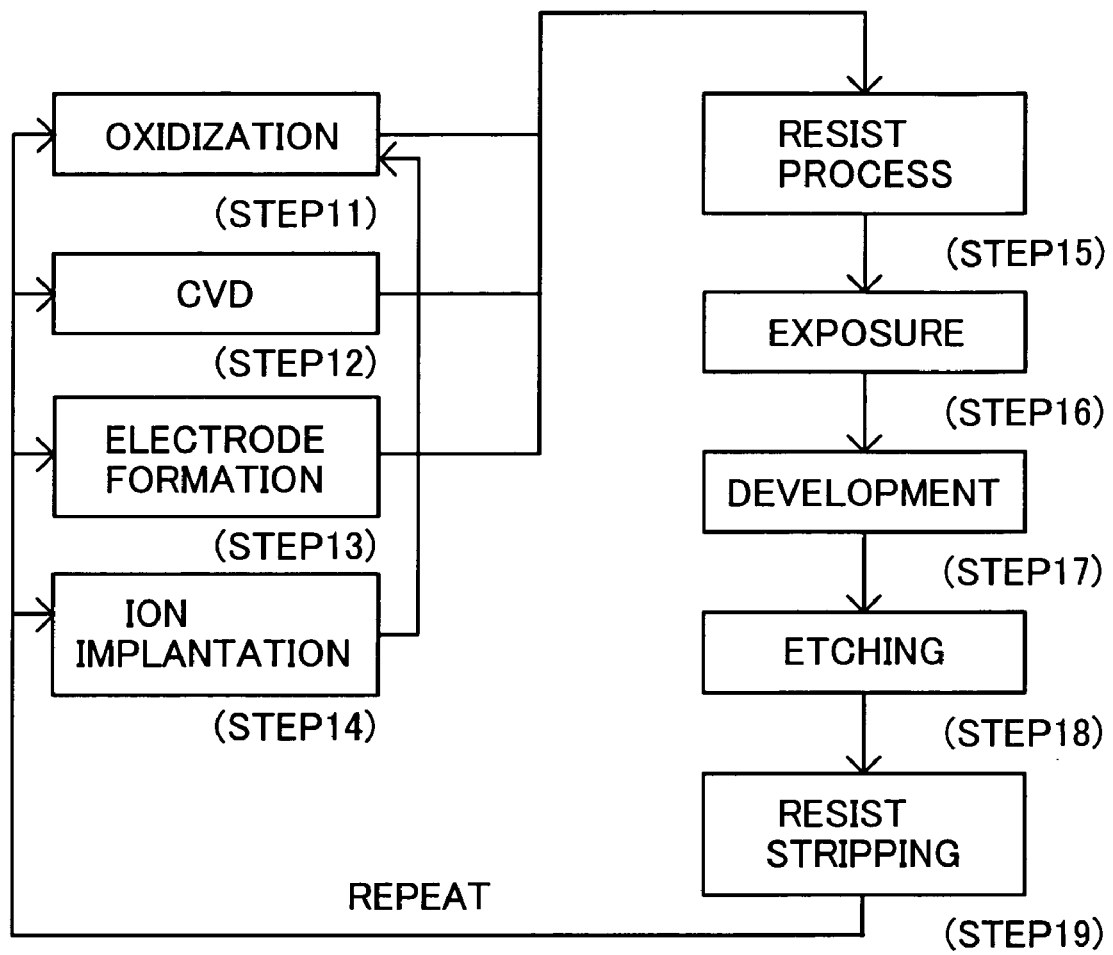
FIG. 9 is a detailed flowchart for Step 4 of wafer process shown in FIG. 8.

Referring now to FIGS. 8 and 9, a description will now be given of an embodiment of a device manufacturing method using the above exposure apparatus 700. FIG. 8 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 15 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 700 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device manufacture method of the present embodiment may manufacture higher quality devices than the conventional one. Thus, the device manufacturing method using the exposure apparatus 700, and resultant devices themselves as intermediate and finished products also constitute one aspect of the present invention.

The present invention is not limited to these preferred embodiments, and various modifications and changes may be made in the present invention without departing from the spirit and scope thereof.

This application claims a foreign priority based on Japanese Patent Application No. 2004-042802, filed Feb. 19, 2004, which is hereby incorporated by reference herein.

What is claimed is:

1. An illumination apparatus for illuminating a target surface using light, said illumination apparatus comprising:
   a light source that emits the light, said light source forming a light emitting portion having different lengths in two orthogonal directions;
   a first optical unit for taking a light from the light emitting portion at the same angle with respect to the two orthogonal directions;
   a reflection integrator that forms plural secondary light sources by reflecting the light from said first optical unit, said reflection integrator having a plurality of mirrors; and
   a second optical unit for introducing a light from the plural secondary light sources to the target surface having different lengths in two orthogonal directions;
   wherein a longitudinal direction of the light emitting portion corresponds to a longitudinal direction of the target surface, and a width direction of the light emitting portion corresponds to a width direction of the target surface.

2. An illumination apparatus according to claim 1, wherein said light has a wavelength between 5 nm and 40 nm.

3. An exposure apparatus for exposing a pattern of a reticle onto an object, said exposure apparatus comprising:
   an illumination apparatus according to claim 1, for illuminating the reticle; and
   a projection optical system for projecting the pattern of the reticle onto the object.

4. A device manufacturing method comprising the steps of:
   exposing an object to be exposed using an exposure apparatus; and
   developing the object exposed,
   wherein said exposure apparatus includes:
      an illumination apparatus according to claim 1, for illuminating the reticle; and
      a projection optical system for projecting the pattern of the reticle onto the object.

5. An illumination apparatus according to claim 1, wherein said light source generates plural plasmas that are arranged in the longitudinal direction of the light emitting portion.

6. An illumination apparatus for illuminating a target surface using light, said illumination apparatus comprising:
   a light source that emit the light;
   a first mirror unit for splitting the light from said light source into plural spaced beams;
   a second mirror unit for coupling the plural beams split by said first mirror unit into one beam having a sectional shape with different lengths in two orthogonal directions;
   a reflection integrator that forms plural secondary light sources by reflecting the light from said second mirror unit, said reflection integrator having a plurality of mirrors; and
   an optical unit for introducing a light from the plural secondary light sources to the target surface having different lengths in two orthogonal directions,
   wherein a longitudinal direction of the beam integrated by said second mirror unit corresponds to a longitudinal direction of the target surface, and a width direction of the beam integrated by said second mirror unit corresponds to a width direction of the target surface.

7. An illumination apparatus according to claim 6, wherein said first mirror unit includes plural mirrors for deflecting the light from said light source at different positions, and said second mirror unit includes plural mirrors for receiving lights from the plural mirrors in said first mirror unit and for deflecting the lights from the plural mirrors in said first mirror unit at different positions, a polarization direction of the plural mirrors in said first mirror unit being orthogonal to that of the plural mirrors in said second mirror unit, and
   wherein the polarization direction of the plural mirrors in said first mirror unit corresponds to the longitudinal direction of the target surface, and the polarization direction of the plural mirrors in said second mirror unit corresponds to the width direction of the target surface.

8. An illumination apparatus according to claim 6, wherein said light has a wavelength between 5 nm and 40 nm.

9. An exposure apparatus for exposing a pattern of a reticle onto an object said exposure apparatus comprising:
   an illumination apparatus according to claim 6 for illuminating the reticle; and
   a projection optical system for projecting the pattern of the reticle onto the object.

10. A device manufacturing method comprising the steps of:
   exposing an object to be exposed using an exposure apparatus; and
   developing the object exposed,
   wherein said exposure apparatus includes:
      an illumination apparatus according to claim 6 for illuminating the reticle; and
      a projection optical system for projecting the pattern of the reticle onto the object.

* * * * *